(12) United States Patent
Ozaki

(10) Patent No.: US 10,485,121 B2
(45) Date of Patent: Nov. 19, 2019

(54) ELECTRICAL CONNECTION BOX AND WIRE HARNESS

(71) Applicant: Yazaki Corporation, Tokyo (JP)

(72) Inventor: Shinya Ozaki, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 15/467,505

(22) Filed: Mar. 23, 2017

(65) Prior Publication Data

US 2017/0311460 A1  Oct. 26, 2017

(30) Foreign Application Priority Data

Apr. 26, 2016 (JP) .................................. 2016-087750

(51) Int. Cl.
*H05K 5/02* (2006.01)
*H02G 15/06* (2006.01)
(Continued)

(52) U.S. Cl.
CPC ........... *H05K 5/0217* (2013.01); *H02G 15/06* (2013.01); *H05K 5/0026* (2013.01); *H05K 5/0247* (2013.01); *H05K 5/03* (2013.01)

(58) Field of Classification Search
CPC ...... H05K 5/0217; H05K 5/03; H05K 5/0247; H05K 5/0026; H02G 15/06
See application file for complete search history.

(56) References Cited

U.S. PATENT DOCUMENTS 4,894,018 A * 1/1990 Phillips .................. H05K 1/119
439/688
5,011,417 A * 4/1991 Matsumoto .......... H01R 9/2458
361/775
(Continued)

FOREIGN PATENT DOCUMENTS

CN 101577262 A 11/2009
CN 105122565 A 12/2015
(Continued)

OTHER PUBLICATIONS

Japanese Office Action for the related Japanese Patent Application No. 2016-087750 dated May 15, 2018.
(Continued)

*Primary Examiner* — David M Sinclair
*Assistant Examiner* — Theron S Milliser
(74) *Attorney, Agent, or Firm* — Kenealy Vaidya LLP

(57) ABSTRACT

An accommodating member in which an electronic component is accommodated, a cover member that is assembled to the accommodating member to block an opening by being moved toward the opening of the accommodating member, and a positioning structure arranged in an internal space of a housing including at least the assembled accommodating member and the cover member, and which performs positioning at the time of assembly of the accommodating member and the cover member are at least included, and the positioning structure includes a positioning pin arranged inside one of the accommodating member and the cover member, and extending along an assembling direction of the accommodating member and the cover member, and a pin insertion portion arranged inside the other of the accommodating member and the cover member, and into which the positioning pin is inserted at the time of assembly of the accommodating member and the cover member.

9 Claims, 8 Drawing Sheets

(51) Int. Cl.
*H05K 5/00* (2006.01)
*H05K 5/03* (2006.01)

(56) References Cited

U.S. PATENT DOCUMENTS

| | | | | |
|---|---|---|---|---|
| 5,266,047 | A * | 11/1993 | Black | H01R 13/631 |
| | | | | 439/364 |
| 5,608,611 | A * | 3/1997 | Szudarek | B60R 16/0239 |
| | | | | 174/138 G |
| 5,755,579 | A * | 5/1998 | Yanase | H01R 31/00 |
| | | | | 439/76.2 |
| 5,782,651 | A * | 7/1998 | Konoya | H01R 4/2429 |
| | | | | 439/405 |
| 5,967,819 | A * | 10/1999 | Okada | H01R 9/245 |
| | | | | 439/212 |
| 5,995,380 | A * | 11/1999 | Maue | B60R 16/0238 |
| | | | | 174/254 |
| 6,224,397 | B1 * | 5/2001 | Nakamura | H01R 9/24 |
| | | | | 439/76.2 |
| 6,259,027 | B1 | 7/2001 | Watanabe | |
| 6,270,359 | B1 * | 8/2001 | Kondo | B60R 16/0239 |
| | | | | 439/76.2 |
| 6,354,846 | B1 * | 3/2002 | Murakami | H01R 9/226 |
| | | | | 439/148 |
| 6,430,055 | B2 * | 8/2002 | Saito | B60R 16/0238 |
| | | | | 361/752 |
| 6,522,528 | B2 * | 2/2003 | Yamane | B60R 16/0238 |
| | | | | 361/601 |
| 6,570,088 | B1 * | 5/2003 | Depp | B60R 16/0238 |
| | | | | 174/50 |
| 6,590,780 | B2 * | 7/2003 | Modi | H01R 9/226 |
| | | | | 174/50 |
| 6,870,096 | B2 * | 3/2005 | Suzuki | H05K 7/026 |
| | | | | 174/50 |
| 6,898,077 | B2 * | 5/2005 | Henson | H05K 5/0208 |
| | | | | 361/679.33 |
| 7,815,443 | B2 * | 10/2010 | Miyamoto | H05K 7/026 |
| | | | | 439/76.2 |
| 7,911,787 | B2 * | 3/2011 | Cheng | H05K 5/0213 |
| | | | | 220/4.02 |
| 8,207,454 | B2 * | 6/2012 | Darr | H05K 7/026 |
| | | | | 174/520 |
| 8,238,108 | B2 | 8/2012 | Hornkamp | |
| 8,627,564 | B2 * | 1/2014 | Blossfeld | H01R 12/00 |
| | | | | 29/883 |
| 9,378,912 | B2 | 6/2016 | Kawamura | |
| 9,640,901 | B2 | 5/2017 | Hasegawa et al. | |
| 2010/0165582 | A1 * | 7/2010 | Hornkamp | H01L 23/053 |
| | | | | 361/740 |
| 2016/0020049 | A1 | 1/2016 | Kawamura | |
| 2016/0072222 | A1 | 3/2016 | Hasegawa et al. | |

FOREIGN PATENT DOCUMENTS

| | | |
|---|---|---|
| CN | 105165132 A | 12/2015 |
| EP | 2 579 408 A2 | 4/2013 |
| EP | 2 579 408 A3 | 11/2014 |
| JP | 7-23935 U | 5/1995 |
| JP | 7-308012 A | 11/1995 |
| JP | 11-122753 A | 4/1999 |
| JP | 2011-114954 A | 6/2011 |
| JP | 2012-120318 A | 6/2012 |
| JP | 2013-85340 A | 5/2013 |
| JP | 2015-186334 A | 10/2015 |

OTHER PUBLICATIONS

Chinese Office Action for the related Chinese Patent Application No. 201710277945.1 dated Jul. 4, 2018.

Chinese Office Action for the related Chinese Patent Application No. 201710277945.1 dated Mar. 1, 2019.

\* cited by examiner

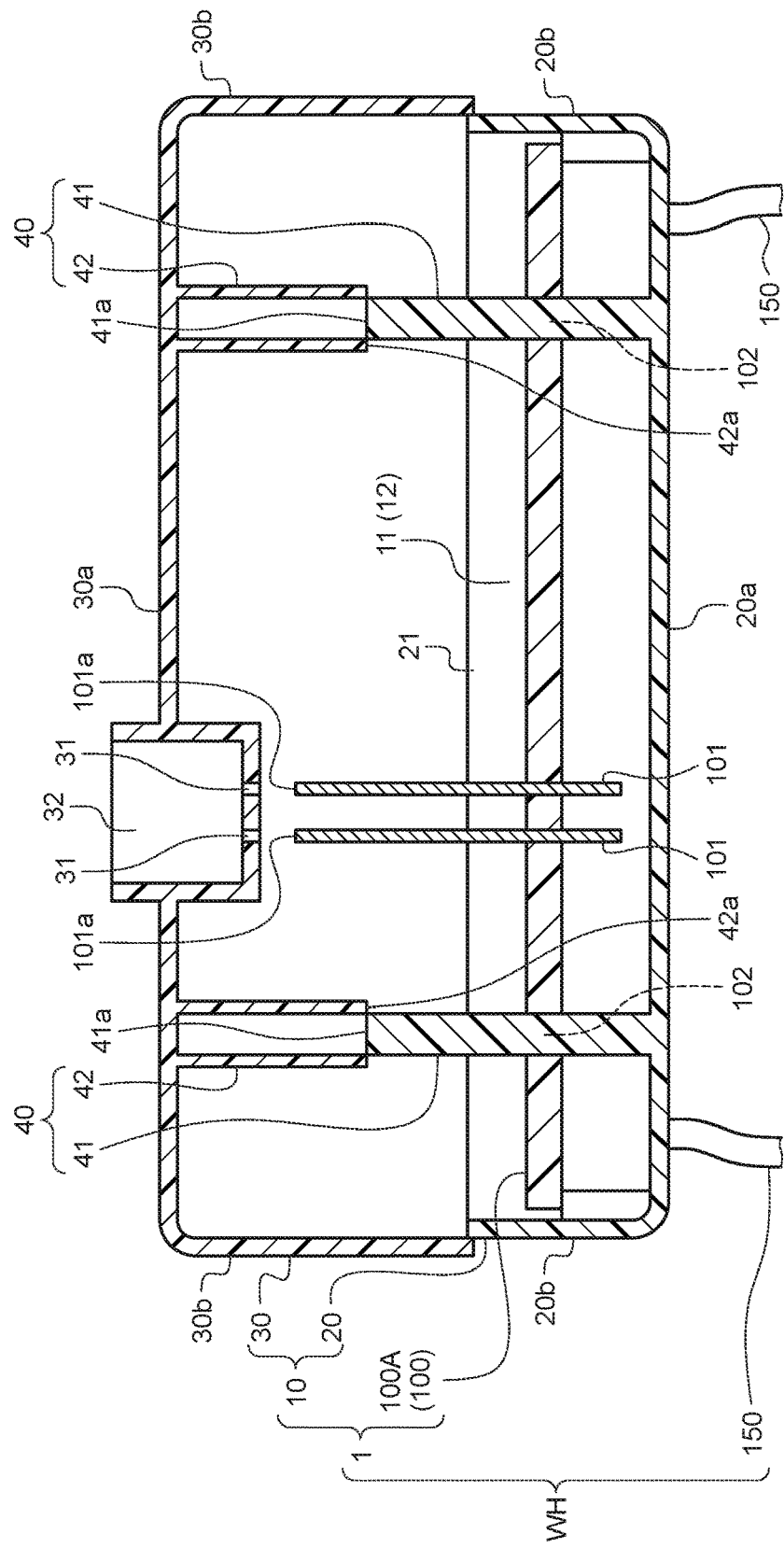

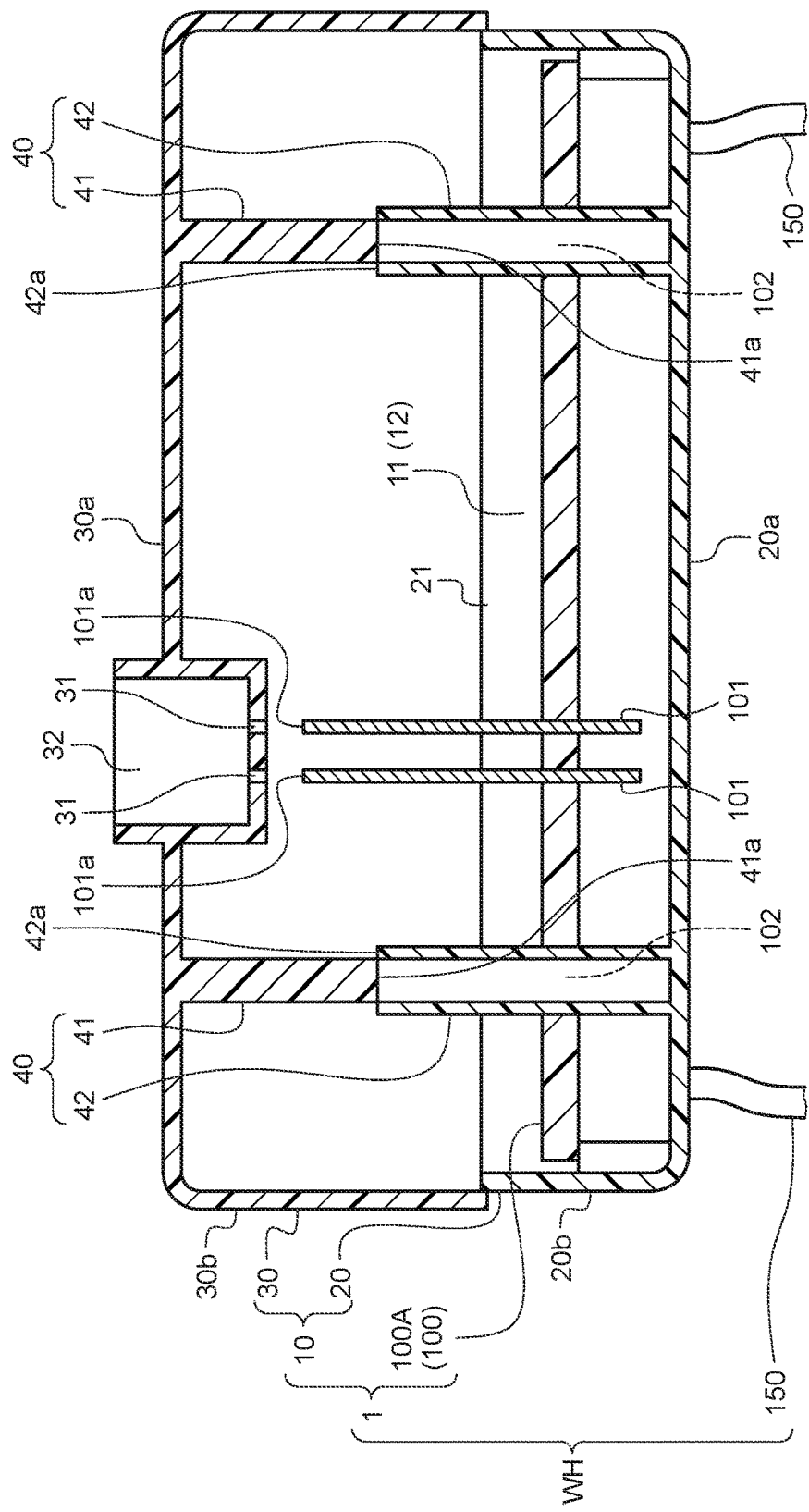

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2016-087750 filed in Japan on Apr. 26, 2016.

BACKGROUND OF THE INVENTION

1. Field of the Invention

The present invention relates to an electrical connection box and a wire harness.

2. Description of the Related Art

Conventionally, an electrical connection box having electronic components accommodated in an accommodating chamber inside a housing and having the electronic components and electric wires electrically connected in the accommodating chamber, and a wire harness including the electrical connection box are known. Here, the housing of the electrical connection box has a divided structure divided into a plurality of housing members, and is formed as a box body by assembling the housing members. In assembly, to improve assembly workability, a positioning structure with positioning pins and through holes is used. For example, the housing is assembled while the positioning pins installed in a jig in a standing manner are inserted into the through holes in the housing members. In a positioning structure of Japanese Patent No. 2946276, positioning pins and through holes are respectively provided in two housing members to be assembled. Note that the positioning structures of these sorts have a possibility of allowing unnecessary objects such as a liquid and dust to intrude into the accommodating chambers through the through holes exposed to an outside, and thus the through holes need to be additionally blocked. One of housing members of an electrical connection box of Japanese Patent Application Laid-open No. 2013-85340 is integrally molded with a cover unit that blocks the through holes. That is, recessed portions for insertion of positioning pins are formed in the housing member. Note that, in an electrical connection box of Japanese Patent Application Laid-open No. 2011-114954, positioning pins are used for positioning of an intermediate plate and a board in an accommodating chamber.

By the way, in the electrical connection box of Japanese Patent Application Laid-open No. 2013-85340, with the view to protect a terminal exposed to an outside of the housing, the positioning pins protrude than the terminal does. Therefore, to provide the recessed portions for insertion of the positioning pins, a part of the housing member is expanded outside in the electrical connection box. Such an expanded portion may become an unsuitable portion in implementing measures to interference with peripheral components and in terms of how it looks.

SUMMARY OF THE INVENTION

Therefore, an objective of the present invention is to provide an electrical connection box provided with a positioning structure by which suppression effect of intrusion of unnecessary objects can be obtained while a housing have an appropriate external form, and a wire harness including the electrical connection box.

An electrical connection box according to one aspect of the present invention includes: an accommodating member in which at least an electronic component is accommodated; a cover member that is assembled to the accommodating member to block an opening by being moved toward the opening of the accommodating member; and a positioning structure that is arranged in an internal space of a housing including at least the assembled accommodating member and the cover member, and configured to perform positioning in assembly of the accommodating member and the cover member, wherein the positioning structure includes a positioning pin provided inside one of the accommodating member and the cover member, and extending along an assembling direction of the accommodating member and the cover member, and a pin insertion portion provided inside the other of the accommodating member and the cover member, and into which the positioning pin is inserted in the assembly of the accommodating member and the cover member.

According to another aspect of the present invention, in the electrical connection box, it is preferable that the electronic component includes a terminal protruding from the accommodating member toward the cover member, in a case where the terminal is exposed to an outside through the cover member, and the cover member includes a terminal insertion hole that allows the terminal to be inserted from a protruding-side tip end and to be exposed to an outside in the assembly of the accommodating member and the cover member, the positioning structure has the positioning pin and the pin insertion portion formed such that the positioning pin starts to be inserted into the pin insertion portion before the terminal starts to be inserted into the terminal insertion hole and before the terminal comes in contact with the cover member, and in a case where the terminal is arranged in the internal space of the housing, the positioning structure has the positioning pin and the pin insertion portion formed such that the positioning pin starts to be inserted into the pin insertion portion before the protruding-side tip end of the terminal comes in contact with the cover member.

According to still another aspect of the present invention, in the electrical connection box, it is preferable that in a case where the positioning pin is provided in the accommodating member, the positioning pin is formed such that a tip end as an insertion start portion into the pin insertion portion is arranged on an accommodating chamber side of the electronic component with respect to the tip end of the terminal, and in a case where the pin insertion portion is provided in the accommodating member, the pin insertion portion is formed such that a tip end as an insertion start portion of the positioning pin is arranged on the accommodating chamber side of the electronic component with respect to the tip end of the terminal.

A wire harness according to still another aspect of the present invention includes at least: an electronic component; an accommodating member in which at least the electronic component is accommodated; a cover member that is assembled to the accommodating member to block an opening by being moved toward the opening of the accommodating member; a positioning structure that is arranged in an internal space of a housing including at least the assembled accommodating member and the cover member, and configured to perform positioning in assembly of the accommodating member and the cover member; and an electric wire that is electrically connected to the electronic component in the internal space, and pulled out to an outside from the internal space, wherein the positioning structure includes a positioning pin provided inside one of the accommodating member and the cover member, and extending along an assembling direction of the accommodating member and the cover member, and a pin insertion portion provided inside the other of the accommodating member and the cover member, and into which the positioning pin is inserted in the assembly of the accommodating member and the cover member.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 7 is a sectional view illustrating positional relationship between the positioning structure and a terminal of the electrical connection box of the embodiment; and FIG. 8 is a sectional view illustrating positional relationship between the positioning structure and the terminal of the electrical connection box of another example in the embodiment.

DETAILED DESCRIPTION OF THE PREFERRED EMBODIMENTS

Hereinafter, an embodiment of an electrical connection box and a wire harness according to the present invention will be described in detail on the basis of the drawings. Note that the present invention is not limited by the embodiment.

Embodiment

An embodiment of an electrical connection box and a wire harness according to the present invention will be described on the basis of FIGS. 1 to 8.

Figure 1:
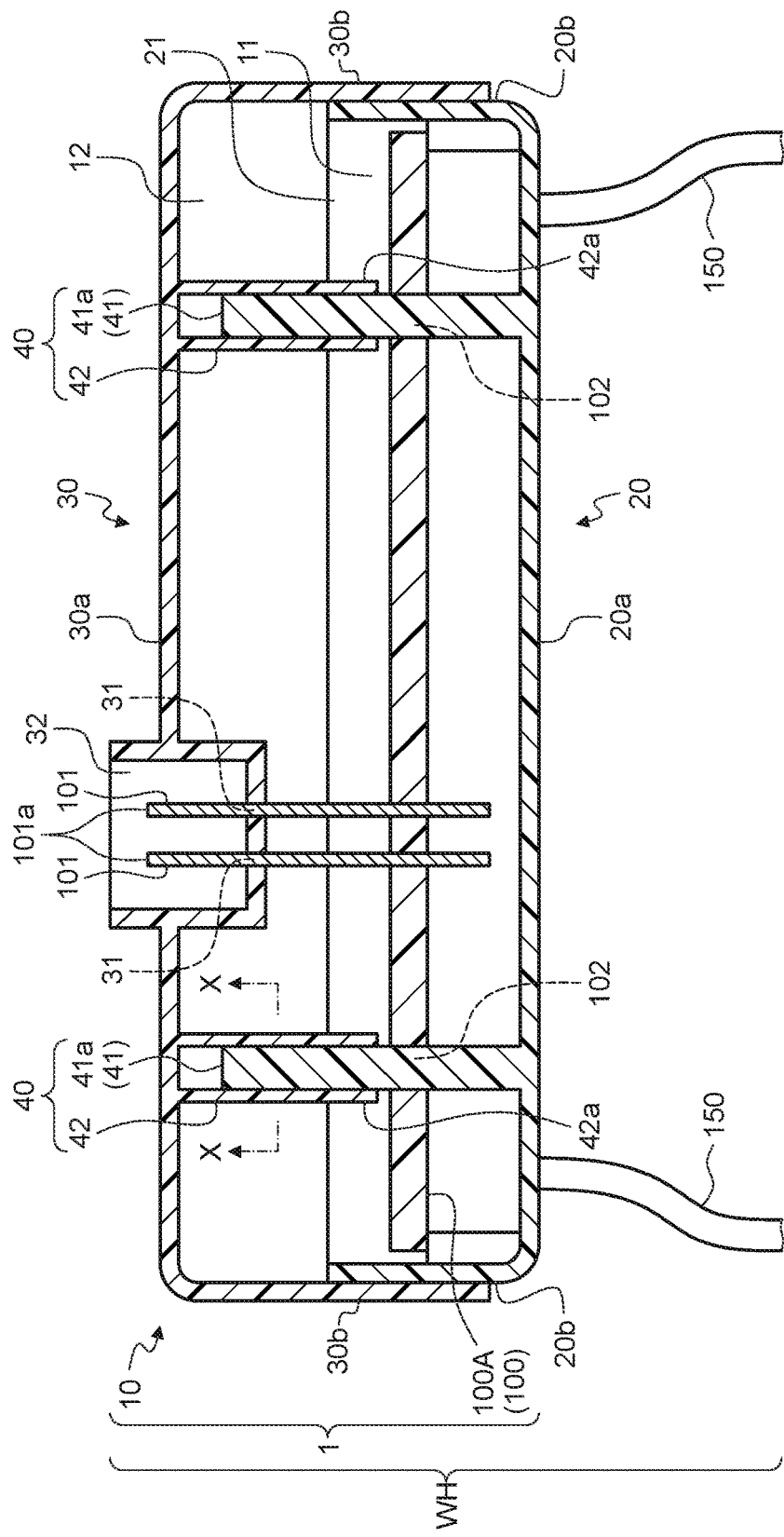
FIG. 1 is a sectional view illustrating an interior of an electrical connection box and a wire harness of an embodiment.
Figure 2:
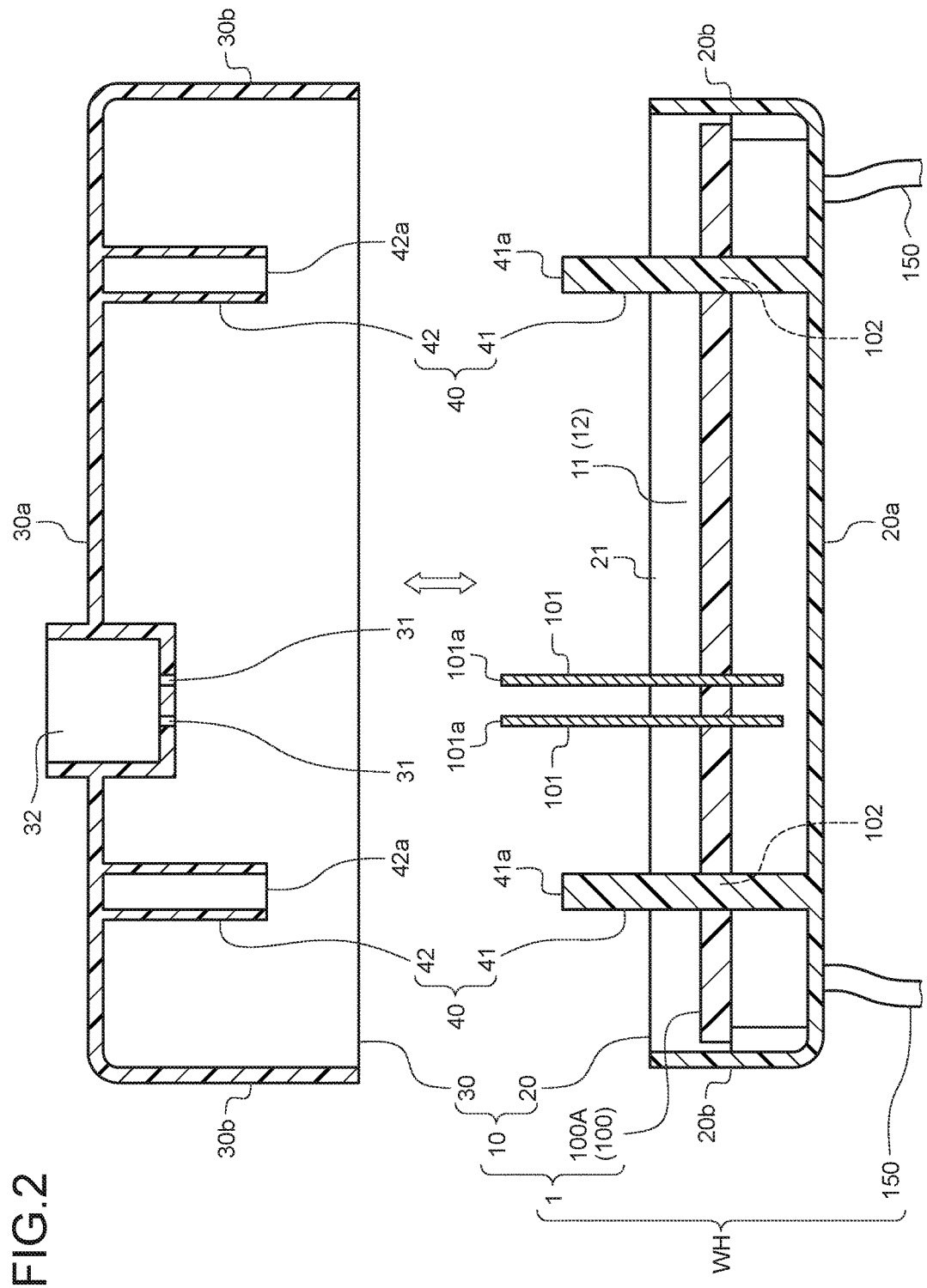
FIG. 2 is a sectional view illustrating an accommodating member and a cover member of the electrical connection box of the embodiment before assembly.

The reference sign 1 in FIGS. 1 and 2 represents an electrical connection box of the present embodiment. The reference sign WH in FIGS. 1 and 2 represents a wire harness including the electrical connection box 1.

The electrical connection box 1 of the present embodiment accommodates, in its interior, various electronic components 100 to be electrically connected with a connection target such as a power source (not illustrated), a load (not illustrated), or a sensor (not illustrated). The electronic components 100 are, for example, circuit protection components such as a relay and a fuse, and a connector. Further, in the present embodiment, a printed board and electronic devices such as an electronic control unit (so called ECU) are also the electronic components 100 accommodated in the electrical connection box 1. Appropriate electric wires (a power supply line, a signal line, and the like) 150 are electrically connected to the accommodated electronic components 100. In the electrical connection box 1, the electric wires 150 are pulled out to an outside. The electrical connection box 1 forms the wire harness WH together with the electric wires 150, and the like. The wire harness WH is arranged in a vehicle, for example, and is connected with a power source (secondary battery) side and an electric device (an actuator or the like) side as a load through the electric wires 150.

The electrical connection box 1 includes a housing 10 in which at least the electronic components 100 are accommodated, and from which the electric wires 150 electrically connected with the electronic components 100 are pulled out to an outside. The housing 10 is mold with an insulating material such as a synthetic resin, and has a space in its interior, in which the electronic components 100 are accommodated. At least one accommodating chamber 11 that accommodates the electronic component 100 is formed in the space in the interior. The housing 10 in this example includes one accommodating chamber 11, and the accommodating chamber 11 accommodates one electronic component 100.

The housing 10 has a divided structure divided into a plurality of housing members, and is formed as a box body by assembling the housing members. The housing 10 includes, as its housing members, at least an accommodating member 20 and a cover member 30. The housing 10 of the present embodiment is configured from the accommodating member 20 and the cover member 30, and a rectangular parallelepiped box body is formed by assembling the accommodating member 20 and the cover member 30.

The accommodating member 20 accommodates at least the electronic component 100, and the accommodating chamber 11 of the electronic component 100 is formed. The accommodating member 20 of this example includes a rectangular main wall 20a and four rectangular peripheral walls 20b installed in a standing manner from a peripheral edge of the main wall 20a in the same direction. In the accommodating member 20, a rectangular parallelepiped internal space surrounded by the main wall 20a and the four peripheral walls 20b is formed therein, and the internal space is used as the accommodating chamber 11. In the accommodating member 20, a rectangular opening 21 arranged in parallel to the main wall 20a is formed on a free end side of the four peripheral walls 20b. The electronic component 100 is inserted through the opening 21 and is accommodated in the accommodating chamber 11.

Here, a printed board 100A is exemplarily described as the electronic component 100 to be accommodated. The printed board 100A is inserted through the opening 21 along a perpendicular direction to its plate surface and is accommodated in the accommodating chamber 11 in a state where the plate surface faces an inner wall surface of the main wall 20a.

Here, the printed board 100A includes a terminal 101 installed in a hanging manner with respect to the plate surface, and protruding from the accommodating member 20 toward the cover member 30. In the drawings, illustration of other components (other electronic components 100 such as the circuit protection components) mounted on the printed board 100A is omitted for convenience of illustration. The terminal 101 may be directly attached to the printed board 100A, or another electronic component 100 attached to the printed board 100A may include the terminal 101. Further, the terminal 101 may be exposed to an outside of the housing 10 through the cover member 30, or may be arranged in an internal space 12 described below, of the housing 10. In this example, the terminal 101 protrudes through the opening 21 in a state where the printed board 100A is accommodated in the accommodating chamber 11. Further, in this example, the terminal 101 protrudes to and is exposed to an outside of the housing 10 through the cover member 30 in a state where the printed board 100A is accommodated in the internal space 12. Therefore, the terminal 101 protrudes along an assembling direction between the accommodating member 20 and the cover member 30 to enable assembly thereof described below. Therefore, the terminal 101 protrudes in the same direction as an installing direction of the four peripheral walls 20*b*. In this example, the terminal 101 protrudes along a perpendicular direction to the opening 21. For example, the terminal 101 in this example is molded into a rectangular plate shape, and one end in a longitudinal direction is exposed to an outside of the housing 10.

The cover member 30 blocks the opening 21 of the accommodating member 20 when assembled to the accommodating member 20. The cover member 30 in this example includes a rectangular main wall 30*a* and four rectangular peripheral walls 30*b* installed in a standing manner from a peripheral edge of the main wall 30*a* in the same direction. In the cover member 30, a rectangular parallelepiped internal space is formed by the main wall 30*a* and the four peripheral walls 30*b* therein. In the housing 10 in this example, the accommodating member 20 and the cover member 30 are assembled such that inner wall surfaces of the four peripheral walls 30*b* of the cover member 30 cover outer wall surfaces of the four peripheral walls 20*b* of the accommodating member 20, and the main wall 30*a* of the cover member 30 faces the main wall 20*a* of the accommodating member 20.

The cover member 30 in this example exposes the terminal 101 protruding through the opening 21 of the accommodating member 20 to an outside of the housing 10 by allowing the terminal 101 to be inserted therein. Therefore, the cover member 30 includes a terminal insertion hole 31 into which the terminal 101 is inserted from a protruding-side tip end and through which the terminal 101 is exposed to an outside of the housing 10 at the time of assembly with the accommodating member 20. The terminal insertion hole 31 is formed in the main wall 30*a*. The counterpart terminal of the counterpart connector (not illustrated) is fit into the terminal 101 exposed to an outside through the terminal insertion hole 31, and is electrically connected with the terminal 101. A connector accommodating chamber 32 into which the counterpart connector is inserted and which causes the counterpart terminal to be fit into the terminal 101 along with the insertion is formed in the main wall 30*a* of the cover member 30 in this example.

In the housing 10 in this example, a direction along the installing direction of the peripheral walls 20*b* and 30*b* and the protruding direction (extending direction) of the terminal 101 becomes the assembling direction of the accommodating member 20 and the cover member 30. The cover member 30 is moved toward the opening 21 of the accommodating member 20, thereby to allow the terminal 101 to be inserted into the terminal insertion hole 31, and is assembled with the accommodating member 20 to block the opening 21.

Here, openings (not illustrated) for maintenance of the electronic component 100 may be formed in the main walls 20*a* and 30*a* of the accommodating member 20 and the cover member 30. In this case, the accommodating member 20 and the cover member 30 include cover members that block the openings.

In the housing 10 in the example, the rectangular parallelepiped internal space 12 is formed when the accommodating member 20 and the cover member 30 are assembled. In the internal space 12, the electric wire 150 is electrically connected to the electronic component 100 such as the printed board 100A (a connection state is not illustrated). The electric wire 150 is pulled out to an outside from the internal space 12. For example, a through hole (not illustrated) into which the electric wire 150 is inserted is formed in the main wall 20*a* of the accommodating member 20.

The electrical connection box 1 of the present embodiment further includes a positioning structure 40 that performs positioning between the accommodating member 20 and the cover member 30 at the time of assembly. The positioning structure 40 is arranged in the internal space 12 of the housing 10 that includes at least the assembled accommodating member 20 and cover member 30. In this example, the housing 10 is configured from the accommodating member 20 and the cover member 30, and the positioning structure 40 is arranged in the internal space 12 made from the accommodating member 20 and the cover member 30. The positioning structure 40 includes a positioning pin 41 provided inside one of the accommodating member 20 and the cover member 30, and extending along the assembling direction of the accommodating member 20 and the cover member 30, and a pin insertion portion 42 provided inside the other of the accommodating member 20 and the cover member 30, and into which the positioning pin 41 is inserted at the time of assembly of the accommodating member 20 and the cover member 30.

In the electrical connection box 1, when a worker assembles the accommodating member 20 and the cover member 30, using the positioning structure 40, for example, positioning between the accommodating member 20 and the cover member 30 becomes easy, and contact between components other than between the positioning pin 41 and the pin insertion portion 42 can be suppressed between the accommodating member 20 and the printed board 100A (electronic component 100), and the cover member 30. Therefore, the electrical connection box 1 can protect the accommodating member 20 and the cover member 30 as configuration components, and the accommodated printed board 100A (electronic component 100), and improve durability of the components.

Further, in the electrical connection box 1, the positioning pin 41 is provided inside one of the accommodating member 20 and the cover member 30 and the pin insertion portion 42 is provided inside the other of the accommodating member 20 and the cover member 30 such that the positioning structure 40 is arranged in the internal space 12 of the housing 10. Therefore, the electrical connection box 1 can be provided with the positioning structure 40 without being provided with a through hole that connects the internal space 12 of the housing 10 and an outside and without being provided with a protruding portion such as an expanded portion outside the housing 10. From this, the electrical connection box 1 can suppress intrusion of unnecessary objects such as a liquid and dust into the internal space 12, and can obtain an appropriate external form of the housing 10, in which an increase in size due to the protruding portion, interference with peripheral components, and a decrease in how it looks are suppressed.

As described above, the electrical connection box 1 of the present embodiment enables positioning in assembling the accommodating member 20 and the cover member 30, and by which suppression effect of intrusion of the unnecessary objects can be obtained while the housing 10 has an appropriate external form.

Hereinafter, a specific example of the positioning structure 40 will be described.

The positioning structure 40 is formed such that the shape of the positioning pin 41 and the shape of the pin insertion portion 42 are matched. The positioning pin 41 and the pin insertion portion 42 may be fit into each other with a limited backlash, or may be inserted to include a backlash. In a case of providing the backlash, the backlash is set within a range not to decrease positioning accuracy in assembling the accommodating member 20 and the cover member 30, and to make insertion between the positioning pin 41 and the pin insertion portion 42 easy and facilitate the positioning. In terms of the positioning accuracy, it is desirable to fit the positioning pin 41 and the pin insertion portion 42 into each other. However, in a case where the positioning pin 41 and the pin insertion portion 42 are fit while coming in surface-contact with each other, resistance during the fitting becomes large. Therefore, it is desirable to form the positioning pin 41 and the pin insertion portion 42 such that they are fit while coming in line-contact with each other to make resistance during the fitting small and improve assembly workability of the accommodating member 20 and the cover member 30. Shapes of the positioning pin 41 and the pin insertion portion 42 will be exemplarily described below.

Further, in the positioning structure 40, it is desirable to cause a tip end side of at least one of the positioning pin 41 and the pin insertion portion 42 to protrude from the inside of the arrangement target (the accommodating member 20 or the cover member 30) to allow the worker to recognize the positions of the positioning pin 41 and the pin insertion portion 42, and make insertion work easy.

Further, at least one positioning structure 40 is provided in the internal space 12. For example, in a case where the build of the housing 10 is small, arrangement of the positioning structure 40 in one place may be sufficient. In this case, the positioning structure 40 may just be arranged in one place in the internal space 12. Meanwhile, in a case where the build of the housing 10 is large, it may be difficult to perform appropriate positioning with the positioning structure 40 only in one place. In this case, the positioning structures 40 may be arranged in a plurality of places in the internal space 12. It is desirable to arrange the positioning structures 40 in positions separated from one another if improving accuracy and facility of the positioning. For example, in the case of the rectangular parallelepiped housing 10 like the example, the positioning structures 40 may just be arranged at two corner portions on one of diagonal lines, respectively.

Further, in a case of arranging the positioning structures 40 in a plurality of places in the internal space 12, pairs of the positioning pin 41 and the pin insertion portion 42 may be formed into combinations having the same shape, or may be formed into combinations having a plurality of different shapes. In the latter case, a plurality of pairs of the positioning pin 41 and the pin insertion portion 42 having different shapes in cross section (shapes in cross section perpendicular to an extending direction) or a plurality of pairs of the positioning pin 41 and the pin insertion portion 42 having different lengths may just be arranged.

Further, in a case of providing the positioning pin 41 in the accommodating member 20 in the positioning structure 40, the positioning pin 41 may be installed in a hanging manner from the inner wall surface of the main wall 20a, or may be held by a holding portion (not illustrated) provided on an inner wall surface of the peripheral wall 20b. Meanwhile, the pin insertion portion 42 may be installed in a hanging manner from an inner wall surface of the main wall 30a, may be provided to the inner wall surface of the peripheral wall 30b, or may be held by a holding portion (not illustrated) provided on the inner wall surface of the peripheral wall 30b.

The positioning structure 40 illustrated in FIGS. 1 and 2 has the positioning pin 41 provided in the accommodating member 20, and the pin insertion portion 42 in the cover member 30. In the positioning structure 40, the positioning pin 41 is installed in a hanging manner from the inner wall surface of the main wall 20a, and the pin insertion portion 42 is installed in a hanging manner from the inner wall surface of the main wall 30a.

Figure 3:
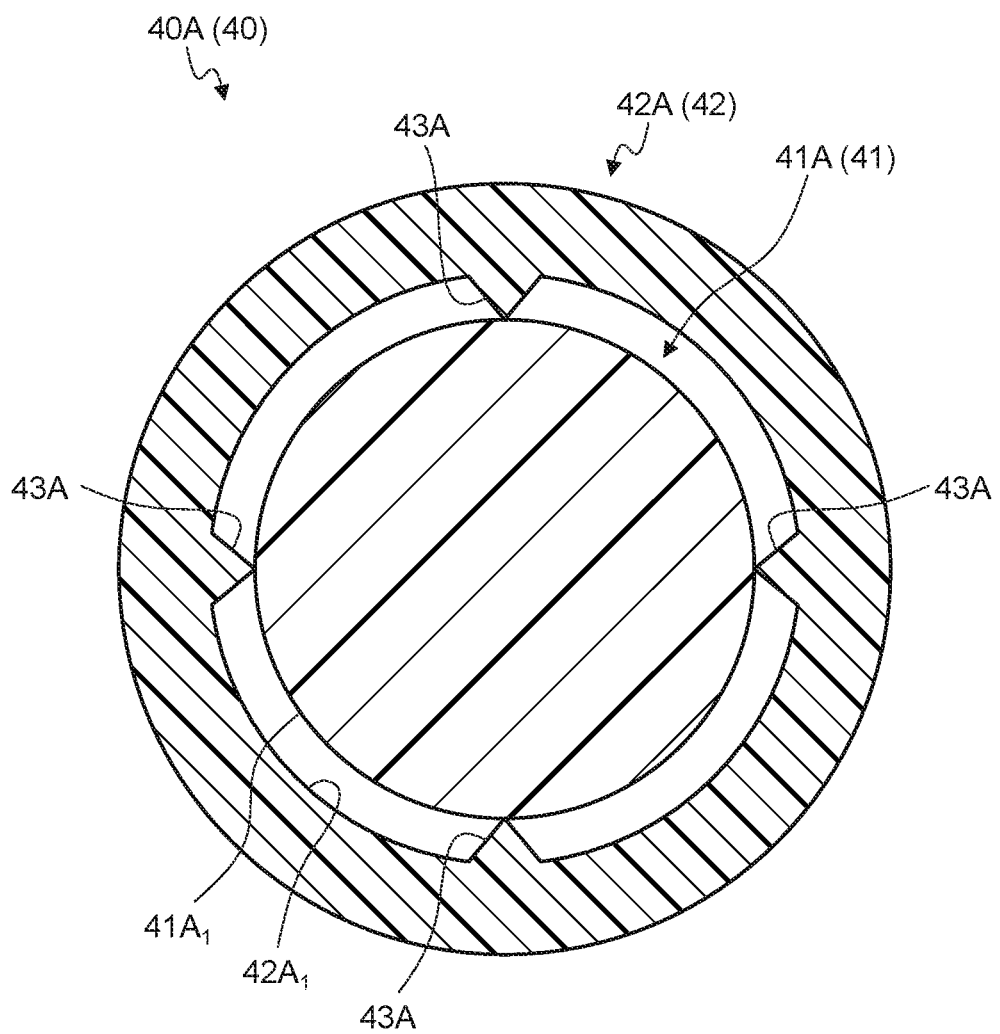
FIG. 3 is an X-X line sectional view of FIG. 1, and is a diagram illustrating an example of a positioning structure.

FIG. 3 illustrates a specific example of the shape of the positioning structure 40. In the example of FIG. 3, the positioning structure 40 is referred to as positioning structure 40A, the positioning pin 41 is referred to as positioning pin 41A, and the pin insertion portion 42 is referred to as pin insertion portion 42A. The positioning pin 41A has a columnar body installed in a hanging manner from the inner wall surface of the main wall 20a. The pin insertion portion 42A is a tubular body installed in a hanging manner from the inner wall surface of the main wall 30a. For example, here, the positioning pin 41A is formed into a cylindrical shape, and the pin insertion portion 42A is formed into a hollow cylindrical shape. FIGS. 1 and 2 illustrate the positioning structure 40A.

In the positioning structure 40A, the positioning pin 41A and the pin insertion portion 42A are formed into a complete circle, or a circle equivalent to the complete circle, so that the positioning pin 41A and the pin insertion portion 42A can be relatively rotated around an axis. Therefore, it is desirable to arrange the positioning structures 40A in a plurality of places in the internal space 12 of the housing 10 so as not to allow the positioning pins 41A and the pin insertion portions 42A to be relatively rotated respectively. Accordingly, in the accommodating member 20 and the cover member 30, positioning at the time of assembly becomes easy. Meanwhile, in the positioning structure 40A, the positioning pin 41A and the pin insertion portion 42A may be formed into an oval shape to suppress the relative rotation. In this case, the positioning at the time of assembly of the accommodating member 20 and the cover member 30 can be easily performed by arranging at least one pair of the positioning structures 40A.

The positioning pin 41 may be inserted into a through hole 102 of the printed board 100A when the printed board 100A is accommodated in the accommodating member 20. Accordingly, the positioning pin 41 also serves a function to perform positioning of the printed board 100A in the accommodating chamber 11.

In the positioning structure 40A, a diameter of an outer peripheral surface $41A_1$ of the positioning pin 41A is made smaller than a diameter of an inner peripheral surface $42A_1$ of the pin insertion portion 42A, and the positioning structure 40A is formed to provide an annular gap between the outer peripheral surface $41A_1$ and the inner peripheral surface $42A_1$. Then, in the positioning structure 40A, a line-contact structure that causes the positioning pin 41A and the pin insertion portion 42A to be in line-contact with each other along an inserting direction thereof is provided between the outer peripheral surface $41A_1$ and the inner peripheral surface $42A_1$.

The line-contact structure is configured from at least three inverted V-shaped ribs 43A formed on one of the outer peripheral surface 41A$_1$ and the inner peripheral surface 42A$_1$. The rib 43A extends in an extending direction of the positioning pin 41A or the pin insertion portion 42A, and the shape in a cross section perpendicular to the extending direction is formed into the inverted V-shape such as a triangle. The rib 43A is formed such that a vertex of the inverted V-shape can come in contact with the other outer peripheral surface 41A$_1$ or the other inner peripheral surface 42A$_1$. Accordingly, the positioning pin 41A and the pin insertion portion 42A are fit into each other while being in line-contact, as described above, thereby to improve assembly workability of the accommodating member 20 and the cover member 30. Here, four ribs 43A are formed on the inner peripheral surface 42A$_1$ of the pin insertion portion 42A at approximately regular intervals, and enable contact of the vertexes of the ribs 43A with the outer peripheral surface 41A$_1$ of the positioning pin 41A.

Here, in a case of providing the rib 43A on the outer peripheral surface 41A$_1$ of the positioning pin 41A, it is desirable to form the rib 43A on the outer peripheral surface 41A$_1$ that avoids a tip end 41a (FIGS. 1 and 2) of the positioning pin 41A. The tip end 41a is a portion corresponding to a portion in the positioning pin 41A, which starts to be inserted into the pin insertion portion 42A (the portion is an insertion start portion in the positioning pin 41A into the pin insertion portion 42A). Further, in a case of providing the rib 43A on the inner peripheral surface 42A$_1$ of the pin insertion portion 42A, it is desirable to form the rib 43A on the inner peripheral surface 42A$_1$ that avoids a tip end 42a (FIGS. 1 and 2) of the pin insertion portion 42A. The tip end 42a is a portion corresponding to a portion in the pin insertion portion 42A, into which the positioning pin 41A starts to be inserted (the portion is an insertion start portion in the pin insertion portion 42A, of the positioning pin 41A). The positioning structure 40A has the ribs 43A arranged in this way, to cause the tip end 41a of the positioning pin 41A to be easily invited into the tip end 42a of the pin insertion portion 42A, thereby to facilitate the positioning between the accommodating member 20 and the cover member 30.

Figure 4:
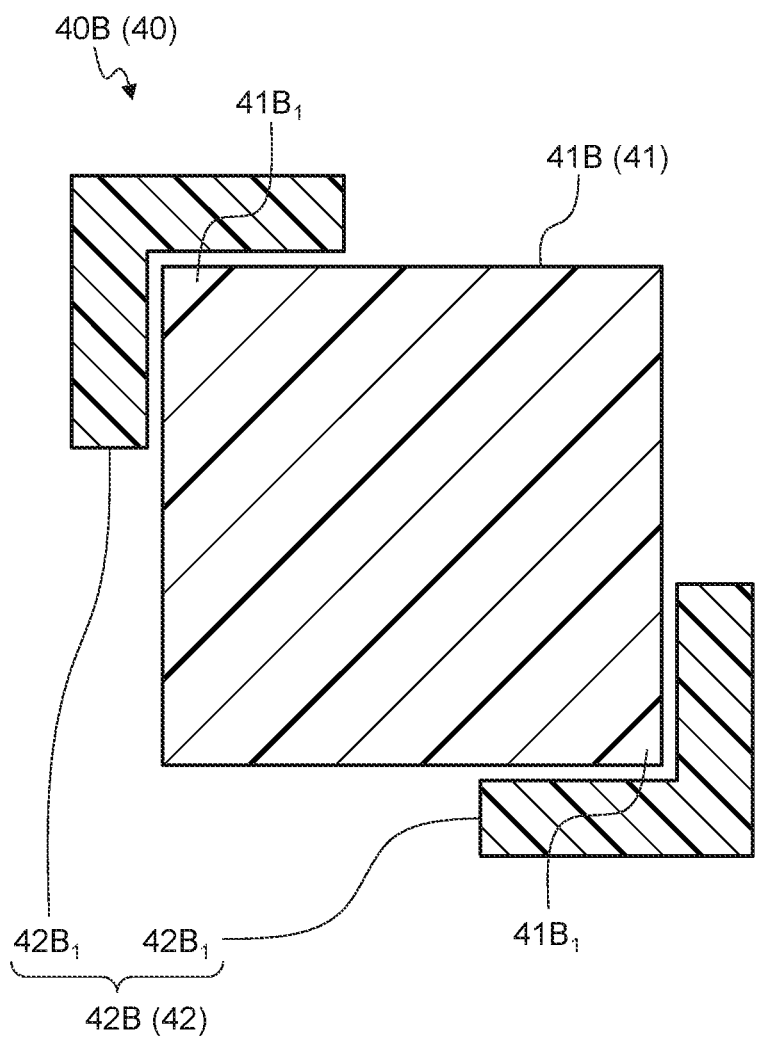
FIG. 4 is a sectional view illustrating a modification form of the positioning structure.

FIG. 4 illustrates another specific example of the shape of the positioning structure 40. In the example of FIG. 4, the positioning structure 40 is referred to as positioning structure 40B, the positioning pin 41 is referred to as positioning pin 41B, and the pin insertion portion 42 is referred to as pin insertion portion 42B. The positioning pin 41B is a columnar body installed in a hanging manner from the inner wall surface of the main wall 20a, and is formed into a prism shape. Here, the quadrangular prism positioning pin 41B is illustrated. The pin insertion portion 42B is made of a plurality of guide bodies 42B$_1$ installed in a hanging manner from the inner wall surface of the main wall 30a, and is arranged to surround the positioning pin 41B with the guide bodies 42B$_1$. In this example, a pair of the guide bodies 42B$_1$ is provided as the pin insertion portion 42B. Each of the guide bodies 42B$_1$ forms an L shape in cross section perpendicular to the extending direction, and the guide bodies 42B$_1$ are arranged to sandwich two corner portions 41B$_1$ on a diagonal line of the positioning pin 41B.

The positioning structure 40B may be provided with a line-contact structure like the above-illustrated example. Further, the positioning structure 40B may have the positioning pin 41B and the pin insertion portion 42B formed such that the two corner portions 41B$_1$ on the diagonal line of the positioning pin 41B can come in contact with planes of the respective guide bodies 42B$_1$ so that the positioning pin 41B and the pin insertion portion 42B come in line-contact with each other along the inserting direction.

In the specific examples so far, the positioning pin 41 is provided in the accommodating member 20, and the pin insertion portion 42 is provided in the cover member 30. In the positioning structure 40 illustrated in FIGS. 5 and 6, the positioning pin 41 is provided in the cover member 30, and the pin insertion portion 42 is provided in the accommodating member 20. In this positioning structure 40, the positioning pin 41 is installed in a hanging manner from the inner wall surface of the main wall 30a of the cover member 30, and the pin insertion portion 42 is installed in a hanging manner from the inner wall surface of the main wall 20a of the accommodating member 20. The positioning pin 41 of the positioning structure 40 and the cover member 30 may just have similar shapes and arrangement to the positioning structure 40 illustrated in FIGS. 1 and 2. The electrical connection box 1 of the present embodiment can obtain similar effect to the above-illustrated example even configured in this way.

Note that, in this case, when the printed board 100A is accommodated in the accommodating member 20, the pin insertion portion 42 is inserted into the through hole 102 of the printed board 100A. Therefore, in the positioning structure 40 here, the pin insertion portion 42 has a function to perform positioning of the printed board 100A in the accommodating chamber 11.

By the way, in the electrical connection box 1 in this example, the terminal 101 of the electronic component 100 (printed board 100A) is exposed to an outside through the cover member 30 in assembling the accommodating member 20 and the cover member 30. Therefore, the terminal 101 may come in contact with the cover member 30 in the assembly.

Therefore, the positioning structure 40 desirably has the positioning pin 41 and the pin insertion portion 42 formed such that the positioning pin 41 starts to be inserted into the pin insertion portion 42 before the terminal 101 starts to be inserted into the terminal insertion hole 31 (FIGS. 7 and 8). Accordingly, the positioning structure 40 suppresses first contact of the terminal 101 with the cover member 30 in assembling the accommodating member 20 and the cover member 30, and can protect the terminal 101. Therefore, the positioning structure 40 can improve durability of the electronic component 100, thereby to improve durability of the electrical connection box 1.

More specifically, here, the assembling direction of the accommodating member 20 and the cover member 30 in the description so far is defined as a reference assembling direction in assembling the accommodating member 20 and the cover member 30. In this case, the positioning structure 40 has the positioning pin 41 and the pin insertion portion 42 formed such that the positioning pin 41 starts to be inserted into the pin insertion portion 42 before the terminal 101 starts to be inserted into the terminal insertion hole 31 and before the terminal 101 comes in contact with the cover member 30, even if the assembling direction of the accommodating member 20 and the cover member 30 is inclined with respect to the reference assembling direction. Accordingly, the protection of the terminal 101 in assembling the accommodating member 20 and the cover member 30 becomes more definite, and the positioning structure 40 can further improve the durability of the electronic component 100 and the electrical connection box 1.

Further, the positioning structure 40 has desirably the positioning pin 41 and the pin insertion portion 42 formed such that the fitting of the peripheral walls 20b and 30b of the accommodating member 20 and the cover member 30 starts after the positioning pin 41 starts to be inserted into the pin insertion portion 42. Accordingly, the positioning structure 40 can suppress fitting of the accommodating member 20 and the cover member 30 in an inclined state, thereby to suppress occurrence of galling during the fitting.

Further, for example, in the case of the positioning structure 40 of FIGS. 1 and 2, the positioning pin 41 is desirably formed such that the tip end 41a is arranged on the accommodating chamber 11 side with respect to the tip end 101a of the terminal 101 of the printed board 100A. As described above, the terminal 101 is exposed to an outside of the housing 10 through the cover member 30. Therefore, with the arrangement of the positioning pin 41, arrangement of the positioning structure 40 in the internal space 12 of the housing 10 becomes easy.

Figure 5:
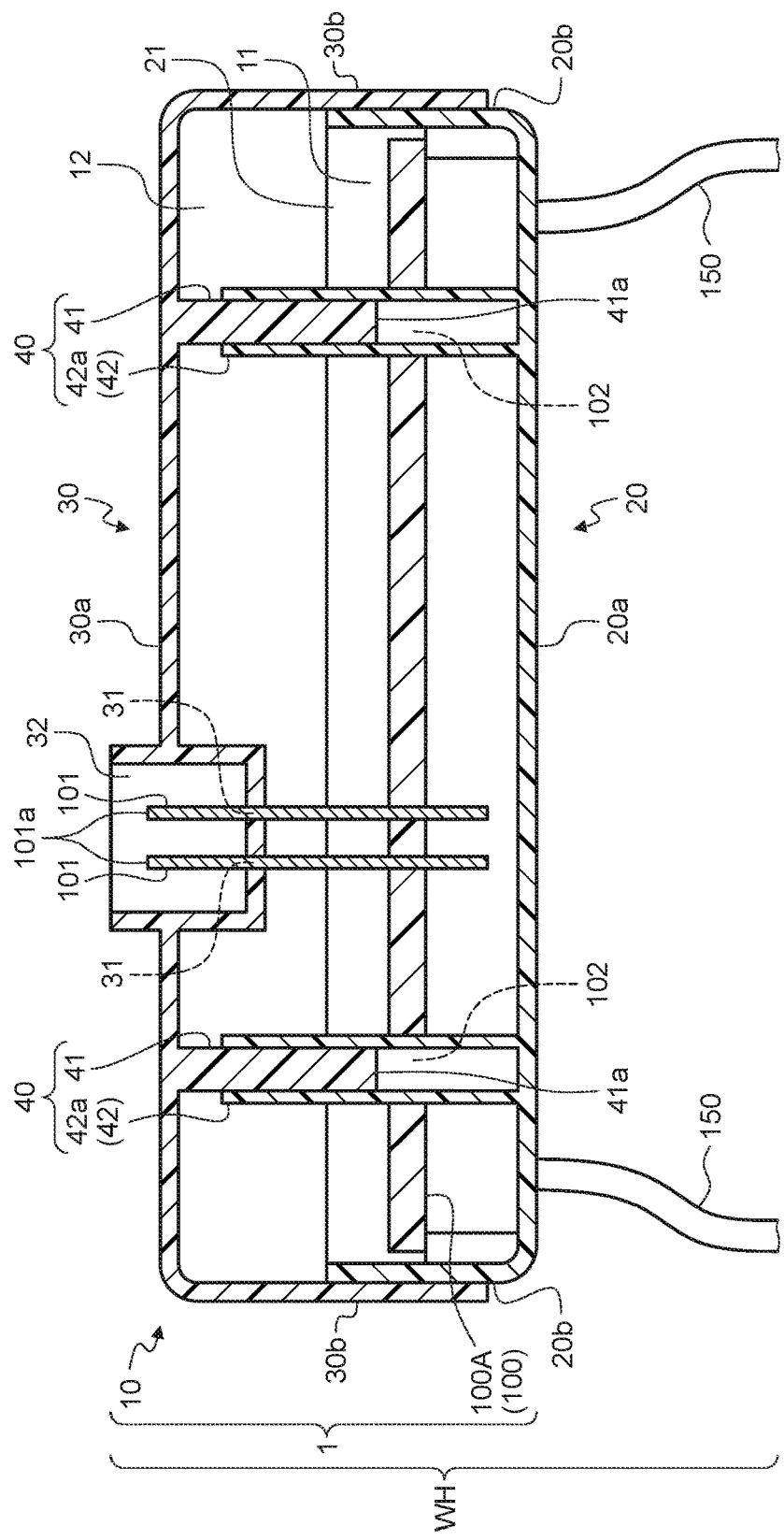
FIG. 5 is a sectional view illustrating the interior of the electrical connection box and the wire harness of another example in the embodiment.
Figure 6:
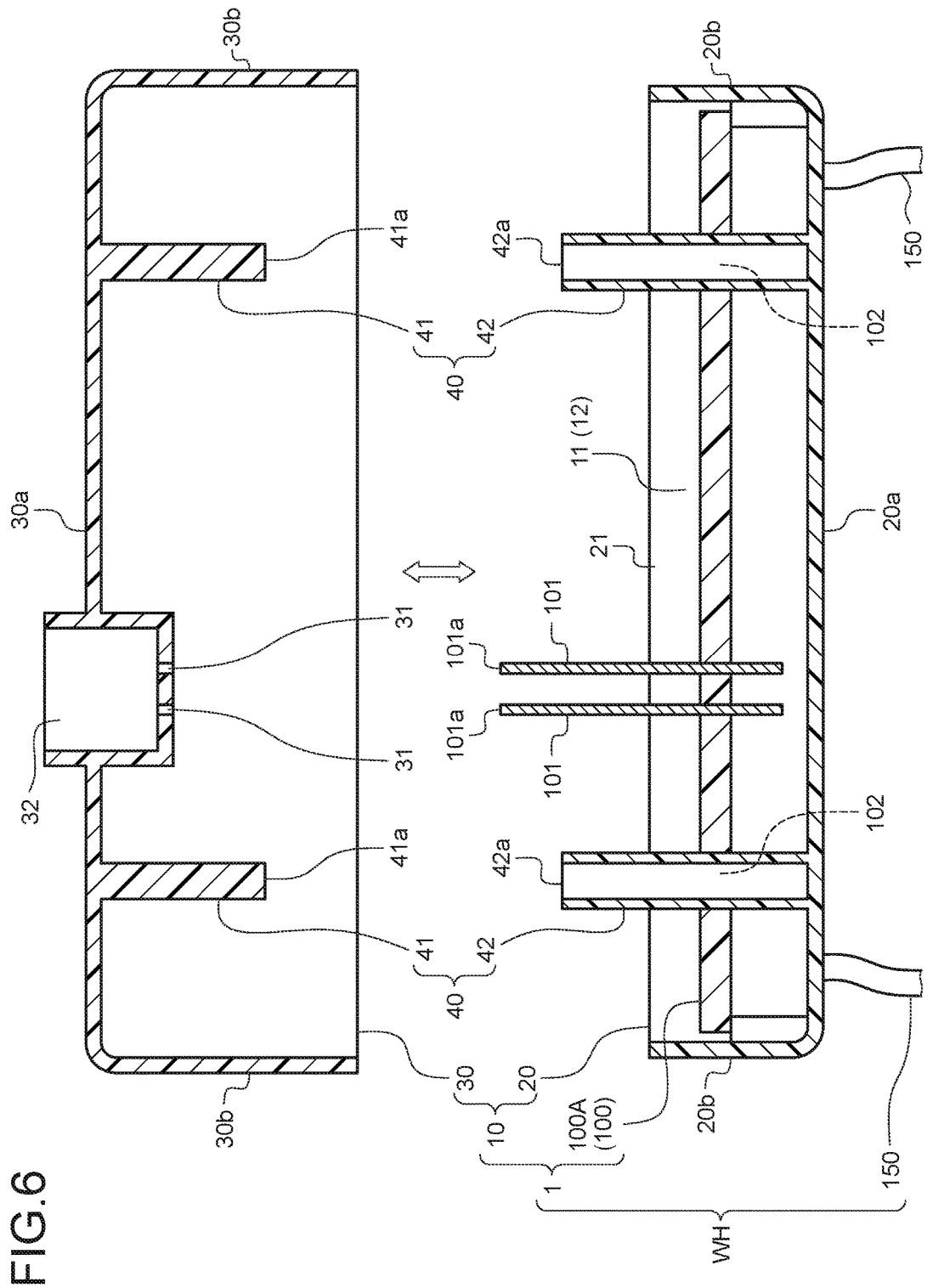
FIG. 6 is a sectional view illustrating the accommodating member and the cover member of the electrical connection box of another example in the embodiment before assembly.

Meanwhile, in the case of the positioning structure 40 of FIGS. 5 and 6, the pin insertion portion 42 is desirably formed such that the tip end 42a is arranged on the accommodating chamber 11 side with respect to the tip end 101a of the terminal 101 of the printed board 100A. With the arrangement of the pin insertion portion 42, arrangement of the positioning structure 40 in the internal space 12 of the housing 10 becomes easy.

Here, the description has been given such that the terminal 101 is exposed to an outside of the housing 10 in the example. However, there is a terminal 101 that is arranged in the internal space 12 of the housing 10 although protruding from the accommodating member 20 toward the cover member 30, as described above. For example, as the terminal 101 of this sort, a tuning fork terminal can be considered. In this case, the terminal 101 is arranged in the internal space 12 of the housing 10, and the counterpart terminal (a rectangular and plate-like male terminal) of the counterpart connector is inserted into the internal space 12 through the terminal insertion hole 31 and is then fit into the terminal 101. Even in the electrical connection box 1 with such the terminal 101, the assembling direction of the accommodating member 20 and the cover member 30 may be inclined with respect to the reference assembling direction until the positioning pin 41 starts to be inserted into the pin insertion portion 42. Then, in a state where the inclination occurs, the cover member 30 may come in contact with the terminal 101 (especially, the protruding-side tip end 101a).

Therefore, in a case where the terminal 101 protrudes from the accommodating member 20 toward the cover member 30, and is arranged in the internal space 12 of the housing 10, the positioning structure 40 has the positioning pin 41 and the pin insertion portion 42 formed such that the positioning pin 41 starts to be inserted into the pin insertion portion 42 before the tip end 101a of the terminal 101 comes in contact with the cover member 30 even if the assembling direction of the accommodating member 20 and the cover member 30 is inclined with respect to the reference assembling direction. Accordingly, the protection of the terminal 101 in assembling the accommodating member 20 and the cover member 30 becomes more definite, and the positioning structure 40 can further improve the durability of the electronic component 100 and the electrical connection box 1, even if the terminal 101 is arranged in the internal space 12.

Even if the positioning structure 40 is configured according to the arrangement of the terminal 101 in the housing 10, the positioning structure 40 desirably has the positioning pin 41 and the pin insertion portion 42 formed such that fitting of the peripheral walls 20b and 30b of the accommodating member 20 and the cover member 30 starts after the positioning pin 41 starts to be inserted into the pin insertion portion 42. Further, in the case of the positioning structure 40 of FIGS. 1 and 2, the positioning pin 41 is desirably formed such that the tip end 41a is arranged on the accommodating chamber 11 side with respect to the tip end 101a of the terminal 101 of the printed board 100A. Meanwhile, in the case of the positioning structure 40 of FIGS. 5 and 6, the pin insertion portion 42 is desirably formed such that the tip end 42a is arranged on the accommodating chamber 11 side with respect to the tip end 101a of the terminal 101 of the printed board 100A.

As described above, the above-described various effects can be obtained by the electrical connection box 1 of the present embodiment. Then, the wire harness WH of the present embodiment includes the electrical connection box 1, and thus can exhibit the effects of the electrical connection box 1.

The electrical connection box and the wire harness according to the present invention have the positioning structure arranged in the internal space of the housing while enabling positioning in assembling the accommodating member and the cover member. Therefore, the suppression effect of intrusion of unnecessary objects into the internal space can be obtained while the housing has an appropriate external form.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
an accommodating member in which at least an electronic component that is a printed board on which an electronic device is mounted is accommodated in an internal space of a housing;
a cover member that is assembled to the accommodating member to block an opening by being moved toward the opening of the accommodating member, the cover member separating the printed circuit board from an outside; and
a positioning structure that is arranged in the internal space of the housing including at least the assembled accommodating member and the cover member, and configured to perform positioning in assembly of the accommodating member and the cover member, wherein
the positioning structure includes a positioning pin provided with one of the accommodating member and the cover member, and extending along an assembling direction of the accommodating member and the cover member, and a pin insertion portion provided with the other of the accommodating member and the cover member, and into which the positioning pin is inserted in the assembly of the accommodating member and the cover member,
the electronic component includes a terminal protruding from the accommodating member toward the cover member from the printed circuit board, and
the terminal is exposed to the outside through the cover member, and the cover member includes a terminal insertion hole that allows the terminal to be inserted from a protruding-side tip end and to be exposed to the outside in the assembly of the accommodating member and the cover member, the positioning structure has the positioning pin and the pin insertion portion formed such that the positioning pin starts to be inserted into the pin insertion portion before the terminal starts to be inserted into the terminal insertion hole and before the terminal comes in contact with the cover member.

2. The electrical connection box according to claim 1, wherein,
in a case where the positioning pin is provided in the accommodating member, the positioning pin is formed such that a tip end as an insertion start portion into the pin insertion portion is arranged on an accommodating chamber side of the electronic component with respect to the tip end of the terminal, and
in a case where the pin insertion portion is provided in the accommodating member, the pin insertion portion is formed such that a tip end as an insertion start portion of the positioning pin is arranged on the accommodating chamber side of the electronic component with respect to the tip end of the terminal.

3. A wire harness comprising:
an electronic component;
an accommodating member in which at least the electronic component that is a printed circuit board on which an electronic device is mounted is accommodated in an internal space of a housing;
a cover member that is assembled to the accommodating member to block an opening by being moved toward the opening of the accommodating member, the cover member separating the printed circuit board from an outside;
a positioning structure that is arranged in the internal space of the housing including at least the assembled accommodating member and the cover member, and configured to perform positioning in assembly of the accommodating member and the cover member; and
an electric wire that is electrically connected to the electronic component in the internal space, and pulled out to an outside from the internal space, wherein
the positioning structure includes a positioning pin provided with one of the accommodating member and the cover member, and extending along an assembling direction of the accommodating member and the cover member, and a pin insertion portion provided with the other of the accommodating member and the cover member, and into which the positioning pin is inserted in the assembly of the accommodating member and the cover member,
the electronic component includes a terminal protruding from the accommodating member toward the cover member from the printed circuit board, and
the terminal is exposed to the outside through the cover member, and the cover member includes a terminal insertion hole that allows the terminal to be inserted from a protruding-side tip end and to be exposed to the outside in the assembly of the accommodating member and the cover member, the positioning structure has the positioning pin and the pin insertion portion formed such that the positioning pin starts to be inserted into the pin insertion portion before the terminal starts to be inserted into the terminal insertion hole and before the terminal comes in contact with the cover member.

4. The electrical connection box according to claim 1, wherein
the positioning pin is installed in a hanging manner from an inner wall surface of the accommodating member, and the pin insertion portion is installed in a hanging manner from an inner wall surface of the cover member.

5. The electrical connection box according to claim 1, wherein
the printed board includes a through hole into which the positioning pin or the pin insertion portion is inserted.

6. The wire harness according to claim 3, wherein
the positioning pin is installed in a hanging manner from an inner wall surface of the accommodating member, and the pin insertion portion is installed in a hanging manner from an inner wall surface of the cover member.

7. The wire harness according to claim 3, wherein
the printed board includes a through hole into which the positioning pin or the pin insertion portion is inserted.

8. The electrical connection box according to claim 1, wherein
a plurality of the positioning structures that respectively includes pairs of the positioning pin and the pin insertion portion are arranged in a plurality of places in the internal space.

9. The electrical connection box according to claim 8, wherein
the pairs of the positioning pin and the pin insertion portion have different lengths.

* * * * *